US006982893B2

(12) United States Patent
Jakobs

(10) Patent No.: US 6,982,893 B2
(45) Date of Patent: Jan. 3, 2006

(54) MEMORY MODULE HAVING A PLURALITY OF INTEGRATED MEMORY COMPONENTS

(75) Inventor: Andreas Jakobs, München (DE)

(73) Assignee: Infineon Technologies, AG, (DE)

(*) Notice: Subject to any disclaimer, the term of this patent is extended or adjusted under 35 U.S.C. 154(b) by 120 days.

(21) Appl. No.: 10/776,467

(22) Filed: Feb. 12, 2004

(65) Prior Publication Data

US 2004/0264151 A1    Dec. 30, 2004

(30) Foreign Application Priority Data

Feb. 12, 2003  (DE) ................................ 103 05 837

(51) Int. Cl.
*G11C 5/06*    (2006.01)
(52) U.S. Cl. .................................... 365/63; 365/230.06
(58) Field of Classification Search ................ 365/63, 365/230.06
See application file for complete search history.

(56) References Cited

U.S. PATENT DOCUMENTS

| 5,357,621 | A   |   | 10/1994 | Cox                         |
|-----------|-----|---|---------|-----------------------------|
| 5,867,446 | A   | * | 2/1999  | Konishi et al. ...... 365/189.05 |
| 6,646,908 | B2  |   | 11/2003 | Täuber et al.               |
| 6,842,398 | B2  | * | 1/2005  | Johnson et al. ...... 365/230.01 |

* cited by examiner

*Primary Examiner*—Tuan T. Nguyen
(74) *Attorney, Agent, or Firm*—Edell, Shapiro & Finnan, LLC

(57) ABSTRACT

A memory module comprises a plurality of integrated memory components which are arranged on a carrier substrate. An access control circuit, which is arranged separately from the memory components on the carrier substrate, is connected, on the input side, to terminals for supplying address and command signals and, on the output side, to the plurality of integrated memory components. The access control circuit is designed in such a manner that, when supplying an address signal, it receives an address for a memory access to a selected memory component; generates, from the address received, at least one column address and row address for accessing a bit line and word line of the selected memory component and transmits the addresses to the latter.

8 Claims, 2 Drawing Sheets

MEMORY MODULE HAVING A PLURALITY OF INTEGRATED MEMORY COMPONENTS

CROSS REFERENCE TO RELATED APPLICATIONS

This application claims priority under 35 §USC 119 to German Application No. DE 10305837.0, filed on Feb. 12, 2003, and titled "Memory Module Having a Plurality of Integrated Memory Components," the entire contents of which are hereby incorporated by reference.

FIELD OF THE INVENTION

The present invention relates to a memory module having a carrier substrate and a plurality of integrated memory components which are arranged on the carrier substrate.

BACKGROUND

For use in computer systems, for example, it is known, in order to form a memory module, to arrange a plurality of memory components, for instance, in the form of DRAMs (Dynamic Random Access Memories), on a common carrier substrate. Memory modules of this type are known, in particular, as DIMMs (Registered or Buffered Dual Inline Memory Modules). The latter are typically fit with 16 or 18 memory chips, which are clock-controlled when in the form of SDRAMs or DDR DRAMs.

Integrated memories, such as DRAMs, are operated in data processing systems and in this case are driven, for example, by a microprocessor or microcontroller. Above a certain size of the memory, for example, in the case of a memory size in excess of 1 Mbit, available DRAM memories generally use a multiplex address scheme. The latter primarily serves the purpose of reducing the number of address terminals of a memory and thus the costs for the individual components in the data processing system and the power consumption of the corresponding address bus systems.

A multiplex address scheme of this type has the advantage that it matches the functionality of a DRAM memory very well. For a memory access, firstly addressed rows in the form of selected word lines and then addressed columns in the form of selected bit lines are generally activated. In the case of this address scheme, firstly row addresses and, temporally thereafter, corresponding column addresses are thus transmitted. A selection is thus made as to the memory cells from which data are read or the memory cells to which data are written. Together with address generation, a microcontroller likewise sends a plurality of individual commands, in particular, in the form of an activation signal, a read command or write command and, to conclude the memory access, a precharge command.

In order that a processor interface of a microprocessor and a DRAM interface can communicate with one another in a data processing system, for instance, a computer system, it is generally necessary to implement a memory controller (DRAM controller) in the computer system in order to convert the DRAM-specific memory access from the commands of the microprocessor. In this case, the memory controller is responsible, in particular, for mapping a logical processor address to the DRAM memory addressed and for generating the row addresses and column addresses for accessing the memory. For the purpose of realizing this functionality, registers and switching mechanisms (automatic state machines), which are suitable for this purpose, must be provided in the memory controller in order to realize this temporal multiplex address scheme. The provision of registers and switching mechanisms of this type increases the design complexity of a memory controller.

SUMMARY

The present invention is based on the object of specifying a memory module of the type mentioned initially, which makes it possible, in the case of use in a data processing system, to reduce the design complexity of a memory controller to be provided in the data processing system.

The memory module according to the invention includes a carrier substrate (having terminals for supplying address and command signals) and a plurality of integrated memory components, which are arranged on the carrier substrate. Provision is furthermore made of an access control circuit, which is arranged separately from the memory components on the carrier substrate and is connected, on the input side, to the terminals for supplying the address and command signals and, on the output side, to the plurality of integrated memory components. The access control circuit is designed in such a manner that, when supplying an address signal which has been generated outside the memory module, it receives an address for the memory access to a memory component which has been selected for the access. The access control circuit respectively generates, from the address received, at least one column address and row address for the purpose of accessing a bit line and word line of the selected memory component and transmits the column address and row address to the latter.

This means that there is, on the memory module according to the invention, an access control circuit, which undertakes the realization of the multiplex address scheme (for the purpose of accessing a memory of the memory module) on behalf of a memory controller and thus relieves the latter of this task. It is therefore no longer necessary to provide appropriate registers and switching mechanisms in the memory controller for the purpose of realizing the multiplex address scheme, with the result that the design complexity of the memory controller can accordingly be reduced.

In one development of the invention, the access control circuit can be designed such that, when supplying an access command which has been generated outside the memory module and indicates the beginning of a memory access, it can receives the command and generates therefrom an access signal sequence for transmission to the selected memory component. The access signal sequence includes at least one activation signal and a subsequent read or write signal. This makes it possible for the memory module to receive only one access command from the memory controller, for example, whereupon the access control circuit generates, within the memory module, an activation signal followed by a read command or write command. This makes possible the need to transmit only one access command between the memory module and a connected memory controller for a memory access. The effective bandwidth of a command bus between the memory module and memory controller is thereby can be doubled.

In one advantageous embodiment of the memory module according to the invention, the access control circuit can be arranged within a separate semiconductor module on the carrier substrate. In a further embodiment, the memory module can be a DIMM module arrangement and the memory components are, in particular, in the form of dynamic random access memories.

BRIEF DESCRIPTION OF THE DRAWINGS

The invention is explained in more detail below with reference to the figures which are illustrated in the drawing, in which.

DETAILED DESCRIPTION

Figure 1:
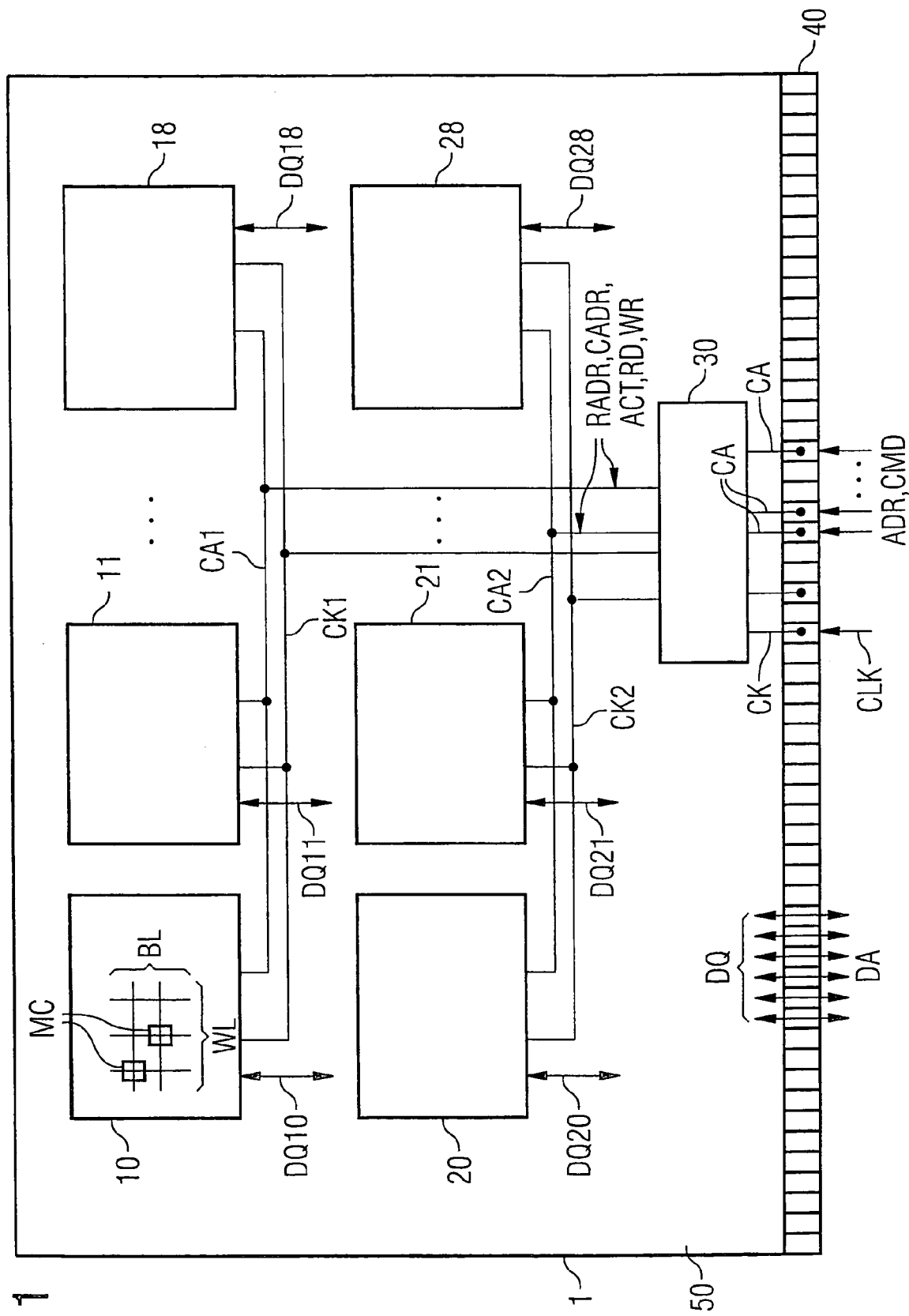
FIG. 1 shows an embodiment of a memory module in accordance with the invention.

FIG. 1 illustrates, in a roughly diagrammatic manner, an embodiment of a memory module in accordance with the invention. The present embodiment is a DIMM module arrangement, in the case of which a plurality of integrated memory components, in this case, in the form of DRAM memories 10 to 18 and 20 to 28, can be arranged on a carrier substrate 50. An access control circuit 30, which is connected to a command and address bus CA and also to a clock signal line CK, is arranged separately from the memory components 10 to 18 and 20 to 28 on the carrier substrate 50. The input-side terminal of the access control circuit 30 can be connected to the contact strip 40 of the memory module 1. The contact strip has terminals for inputting and outputting data signals DA, terminals for inputting a clock signal CLK and terminals for inputting address signals ADR and command signals CMD. On the input side, the access control circuit 30 can be connected to the respective terminals of the contact strip 40 for supplying the address signals ADR and command signals CMD. On the output side, the access control circuit 30 can be connected to a command and address bus CA1 for the first memory rank having the memories 10 to 18 and also to a command and address bus CA2 for the second memory rank having the memories 20 to 28. On the output side, the access control circuit 30 can be furthermore connected to the clock signal line CK1 for driving the memories 10 to 18 of the first memory rank and to the clock signal line CK2 for driving the second memory rank having the memories 20 to 28. For the purpose of interchanging data, the memories 10 to 18 and 20 to 28 can have respective data terminals DQ10 to DQ18 and DQ20 to DQ28 which may be connected to the data terminals DQ of the memory module 1.

As illustrated in more detail by the memory 10, by way of example, the individual memory components can have memory cell arrays having word lines WL for selecting memory cells MC and bit lines BL for reading data signals from, or writing data signals to, the memory cells MC. The memory cells MC can be arranged in a known manner at crossover points of the word lines WL and bit lines BL and are respectively connected to one of the word lines and one of the bit lines. The memory cells MC each have a selection transistor and storage capacitor (not illustrated). The control input of the transistors can be connected to a word line WL which activates connected memory cells MC in the event of a memory access.

The access control circuit 30 can be designed such that, when supplying an address signal ADR which has been generated outside the memory module 1, it can receive an address for a memory access to a selected memory component. The access control circuit can generates, from the address ADR received, at least one column address CADR for accessing a bit line BL and row address RADR for accessing a word line WL of the selected memory component, the column address CADR, and row address RADR being transmitted to the selected memory component via the command and address bus CA1, CA2. The access control circuit 30 can receives an access command R/W which has been generated outside the memory module 1 (also see FIG. 2 in this respect). This access command indicates the beginning of a memory access. Once this access command has been received, the access control circuit 30 can generates therefrom an access signal sequence having an activation signal ACT and, depending on whether a read or write access is involved, a subsequent read or write command RD or WR for transmission to the selected memory component. One command R/W can be used for a read or write access, with the result that the effective bandwidth of the command and address bus CA can be doubled.

In accordance with the multiplex address scheme for a DRAM memory, the column address CADR and row address RADR for accessing a bit line and word line of a selected memory component can be generated successively in time by the access control circuit 30 for transmission to the selected memory component. In particular, the column address CADR and row address RADR can be generated such that they are offset by an RAS-CAS delay time tRCD defined by the type of selected memory component.

Figure 2:
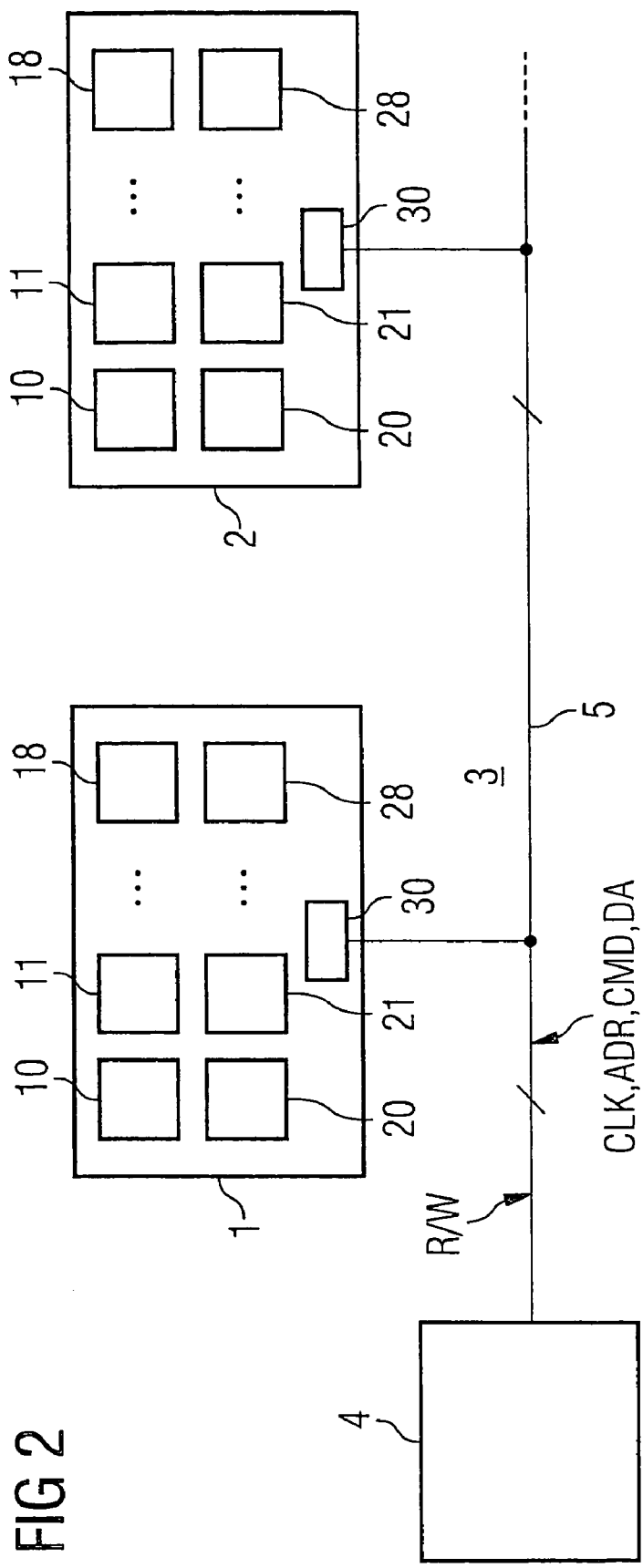
FIG. 2 shows an embodiment of a computer system having a memory controller and a plurality of memory modules in accordance with the invention.

FIG. 2 diagrammatically illustrates an embodiment of an exemplary computer system having a memory controller 4 and a plurality of memory modules 1 and 2 constructed in accordance with the invention. The memory controller 4 can be connected to a transmission bus 5. Both can be situated on a so-called motherboard 3 of the computer system. The DIMM modules 1 and 2 can be connected to the transmission bus 5 via plug connectors. The clock signal CLK, address signals ADR, command signals CMD, data signals DA and the access command R/W can be transmitted to the DIMM modules 1 and 2 on the transmission bus 5.

For a memory access, only the access command R/W, i.e., either a read or write command, can be transmitted, together with the full address ADR (n bits), from the memory controller 4 to the modules 1 and 2. The respective access control circuit 30 on the modules 1, 2 can undertakes the DRAM-specific address multiplexing. This means that a row address RADR (r bits), together with an activation signal ACT, and subsequently a column address CADR (c bits), together with a read or write command RD, WR, can be generated and transmitted to the selected memory component. In this case, n=r+c, it generally being the case that r>n/2>c. The resulting unburdening of the memory controller 4 can reduce the design complexity of the latter. In addition, the access control circuit 30 can decouple the transmission bus 5 of the motherboard 3 and the communication buses within the module. This makes it possible, for example, to operate the transmission bus 5 between the memory controller and DIMM modules at a higher data rate than the communication buses within the module.

A number of implementations have been described. Nevertheless, it will be understood that various modifications may be made without departing from the spirit and scope. Accordingly, other implementations are within the scope of the following claims.

LIST OF REFERENCE SYMBOLS 1, 2 Memory module
3 Motherboard
4 Memory controller
5 Transmission bus
10–18 Memory component
20–28 Memory component 30 Access control circuit
40 Contact strip
50 Carrier substrate
CLK Clock signal
ADR Address signal
CMD Command signal
DA Data signal
CK, CK1, CK2 Clock signal line
CA, CA1, CA2 Command and address bus
DQ10–DQ18 Data terminal
DQ20–DQ28 Data terminal
DQ Data terminals
RADR Row address
CADR Column address
ACT Activation signal
RD Read command
WR Write command
MC Memory cells
WL Word lines
BL Bit lines

I claim:

1. A memory module, comprising:
a carrier substrate having terminals for supplying address and command signals;
a plurality of integrated memory components, the memory components being arranged on the carrier substrate;
an access control circuit the access control circuit being arranged separately from the memory components on the carrier substrate, the access control circuit being connected on the input side to the terminals for supplying the address and command signals, connected on the output side, to the plurality of integrated memory components,
the access control circuit being designed such that, when supplying an address signal, the address signal having been generated outside the memory module, the access control circuit receiving an address for a memory access to a memory component which has been selected for the access, the access control circuit generating from the address received, at least one column address and one row address for accessing a bit line and a word line of the selected memory component, the access control circuit transmitting the addresses to the selected memory component.

2. The memory module as claimed in claim 1, wherein the access control circuit is designed such, that, when supplying an access command, the access command having been generated outside the memory module and indicating the beginning of a memory access, the access control circuit receiving the command and generating therefrom an access signal sequence having at least one activation signal and a subsequent read or write signal for transmission to the selected memory component.

3. The memory module as claimed in claim 1 wherein the column address and row address for accessing a bit line and word line are generated successively in time by the access control circuit for transmission to the selected memory component.

4. The memory module as claimed in claim 3, wherein the column address and row address for accessing a bit line and word line are generated by the access control circuit such that the column address and row address are offset by an RAS-CAS delay time, the latter being defined by the selected memory component.

5. The memory module as claimed in claim 1, wherein the access control circuit is arranged within a separate semiconductor module.

6. The memory module as claimed in claim 1, wherein the input-side terminal of the access control circuit is connected to a contact strip of the memory module.

7. The memory module as claimed in claim 1, wherein the memory module is in the form of a DIMM module arrangement.

8. The memory module as claimed in claim 1, wherein the memory components of the memory module are dynamic random access memories.

* * * * *